United States Patent
Jang

(10) Patent No.: US 8,648,649 B2
(45) Date of Patent: Feb. 11, 2014

(54) VOLTAGE DOWN CONVERTER

(75) Inventor: Chae Kyu Jang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 226 days.

(21) Appl. No.: 13/331,634

(22) Filed: Dec. 20, 2011

(65) Prior Publication Data

US 2012/0169396 A1    Jul. 5, 2012

(30) Foreign Application Priority Data

Dec. 30, 2010  (KR) .................. 10-2010-0139174

(51) Int. Cl.
*G05F 3/02*          (2006.01)
(52) U.S. Cl.
USPC .......................................... 327/540; 327/541
(58) Field of Classification Search
USPC ......................................... 327/538, 540, 541
See application file for complete search history.

(56) References Cited

U.S. PATENT DOCUMENTS

| 7,432,758 B2* | 10/2008 | Chou et al. ............... 327/540 |
| 7,538,602 B2* | 5/2009 | Takeuchi ................. 327/543 |
| 7,839,205 B2* | 11/2010 | Hirobe ................... 327/540 |

FOREIGN PATENT DOCUMENTS

| KR | 1020010053961 | 7/2001 |
| KR | 1020060110045 | 10/2006 |

* cited by examiner

*Primary Examiner* — Hai L Nguyen
(74) *Attorney, Agent, or Firm* — IP & T Group LLP

(57) ABSTRACT

A voltage down converter includes a first driver having a first input terminal configured to generate a first voltage by using an external voltage in response to a first driving signal being inputted to the first input terminal, a control circuit configured to output the first driving signal to the first input terminal in response to a level of the first voltage, a second driver having a second input terminal configured to generate a second voltage by using the external voltage in response to the first driving signal or a second driving signal being inputted to the second input terminal, wherein the first driving signal is transferred from the first input terminal to the second input terminal through a conductive line, and a driving control circuit configured to generate the second driving signal and transferred to the second input terminal in response to a level of the second voltage.

9 Claims, 2 Drawing Sheets

VOLTAGE DOWN CONVERTER

CROSS-REFERENCE TO RELATED APPLICATION

Priority to Korean patent application number 10-2010-0139174 filed on Dec. 30, 2010, the entire disclosure of which is incorporated by reference herein, is claimed.

BACKGROUND

An exemplary embodiment relates to a voltage down converter.

A device operating at a low power, such as a semiconductor memory device, may include a voltage down converter for converting an external voltage into a low voltage.

In general, the voltage down converter includes a comparator for comparing a reference voltage and the feedback voltage of an output voltage in order to control the output voltage and reduce current consumption.

If the down converter is provided remotely from the voltage output terminal of the output voltage, an operating delay may occur in controlling the output voltage.

Here, as the down converter is located farther from the voltage output terminal of the output voltage, it takes a longer time to control the output voltage when the output voltage suddenly drops or rises.

BRIEF SUMMARY

An exemplary embodiment relates to a voltage down converter which is capable of providing a proper voltage by rapidly responding to a voltage shift even when input terminals of a feedback voltage and a reference voltage are provided remotely from an output terminal of the output voltage.

A voltage down converter according to an aspect of the present disclosure includes a first driver having a first input terminal configured to generate a first voltage by using an external voltage in response to a first driving signal being inputted to the first input terminal, a control circuit configured to output the first driving signal to the first input terminal in response to a level of the first voltage, a second driver having a second input terminal configured to generate a second voltage by using the external voltage in response to the first driving signal or a second driving signal being inputted to the second input terminal, wherein the first driving signal is transferred from the first input terminal to the second input terminal through a conductive line, and a driving control circuit configured to generate the second driving signal and transferred to the second input terminal in response to a level of the second voltage.

A voltage down converter according to another aspect of the present disclosure includes a first driver configured to output a first down voltage by dropping an external voltage in response to a driving signal inputted to a control node, a second driver configured to output a second down voltage by dropping the external voltage in response to the driving signal inputted to the control node, and a control circuit configured to output the driving signal to the control node in response to a level of the first down voltage, a level of the second down voltage, and a reference voltage. The control circuit is configured to control the second down voltage to be equal to or higher than a set voltage by discharging a voltage level of the driving signal.

DESCRIPTION OF EMBODIMENTS

Hereinafter, an exemplary embodiment of the present disclosure will be described in detail with reference to the accompanying drawings. The figures are provided to enable those of ordinary skill in the art to make and use the embodiment of the disclosure.

Figure 1:
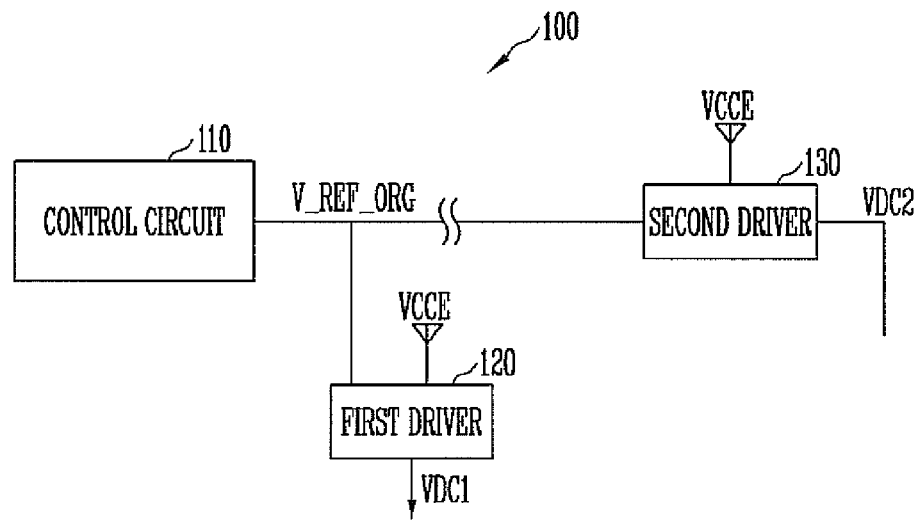
FIG. 1 is a block diagram illustrating a voltage down converter.

FIG. 1 is a block diagram illustrating a conventional voltage down converter.

Referring to FIG. 1, the conventional voltage down converter 100 includes a control circuit 110 and first and second drivers 120 and 130.

The control circuit 110 generates a driving voltage V_REF_ORG for controlling the levels of first and second down voltages VDC1 and VDC2 generated from the first and the second drivers 120 and 130.

The first and the second drivers 120 and 130 generate the first and the second down voltages VDC1 and VDC2 by dropping an input voltage VCCE in response to the driving voltage V_REF_ORG.

The voltage down converter 100 is applied to an integrated circuit (not shown), such as a semiconductor memory device. The first and the second down voltages VDC1 and VDC2 generated from the first and the second drivers 110 and 120 may be supplied to different internal circuits (not shown).

The control circuit 110 may be formed of a comparator COM.

Figure 2:
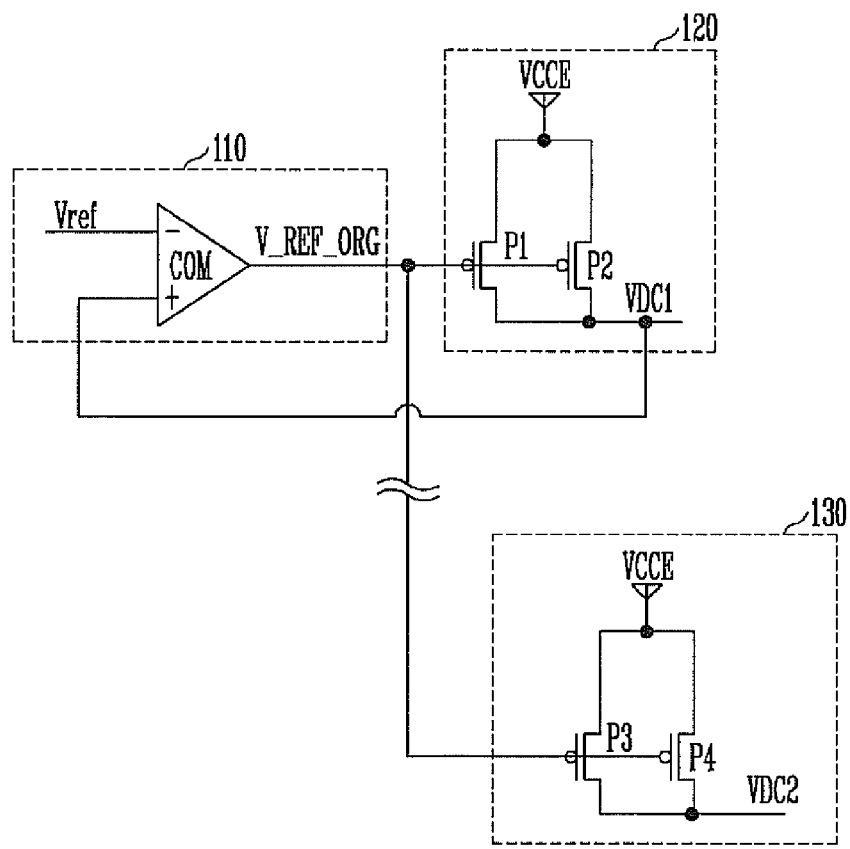
FIG. 2 is a detailed circuit diagram of the voltage down converter shown in FIG. 1.

FIG. 2 is a detailed circuit diagram of the voltage down converter 100 shown in FIG. 1.

Referring to FIG. 2, the control circuit 110 is formed of the comparator COM. The first and the second drivers 120 and 130 are formed of a plurality of PMOS transistors.

A reference voltage Vref is inputted to the non-inverting terminal (−) of the comparator COM, and the first down voltage VDC1 outputted from the first driver 120 is inputted to the inverting terminal (+) of the comparator COM. The output of the comparator COM is the driving voltage V_REF_ORG.

The reference voltage Vref inputted to the comparator COM may be generated from an internal circuit, such as an integrated circuit (not shown) to which the voltage down converter 100 is applied.

When the reference voltage Vref is higher than the first down voltage VDC1, the comparator COM outputs the driving voltage V_REF_ORG of a low level. When the reference voltage Vref is lower than the first down voltage VDC1, the comparator COM outputs the driving voltage V_REF_ORG of a high level.

The first and the second drivers 120 and 130 output the first and the second down voltages VDC1 and VDC2, respectively, in response to the driving voltage V_REF_ORG.

The first driver 120 includes first and second PMOS transistors P1 and P2. The second driver 130 includes third and fourth PMOS transistors P3 and P4.

The first and the second PMOS transistors P1 and P2 are coupled between a terminal to which the input voltage VCCE is inputted and a terminal from which the first down voltage VDC1 is outputted. The driving voltage V_REF_ORG is inputted to the gates of the first and the second PMOS transistors P1 and P2.

The third and the fourth PMOS transistors P3 and P4 are coupled between the terminal to which the input voltage VCCE is inputted and a terminal from which the second down voltage VDC2 is outputted. The driving voltage V_REF_ORG is inputted to the gates of the third and the fourth PMOS transistors P3 and P4.

When the input voltage VCCE starts to be inputted, the driving voltage V_REF_ORG is 0 V. Accordingly, the first and the second PMOS transistors P1 and P2 are turned on. When the first and the second PMOS transistors P1 and P2 are turned on, the input voltage VCCE is supplied to the terminal from which the first down voltage VDC1 is outputted.

When the first down voltage VDC1 is higher than the reference voltage Vref, the comparator COM outputs the driving voltage V_REF_ORG of a high level. In response to the driving voltage V_REF_ORG of a high level, the first and the second PMOS transistors P1 and P2 are turned off.

Consequently, the first down voltage VDC1 drops because the input voltage VCCE is not supplied to the terminal from which the first down voltage VDC1 is outputted.

Meanwhile, the third and the fourth PMOS transistors P3 and P4 of the second driver 130 are also controlled in response to the driving voltage V_REF_ORG.

When the second driver 130 is far from the control circuit 110 as shown in FIG. 2, the driving voltage V_REF_ORG may not be properly inputted to the second driver 130.

This is because the driving voltage V_REF_ORG inputted to the second driver 130 may be delayed and distorted due to a capacitance component and the resistance component of an electric wire through which the driving voltage V_REF_ORG is transferred and the like.

If the driving voltage V_REF_ORG of the control circuit 110 is not properly inputted to the second driver 120, the second driver 130 may not uniformly maintain the second down voltage VDC2.

The above features may be addressed by a voltage down converter according to an exemplary embodiment of this disclosure.

Figure 3:
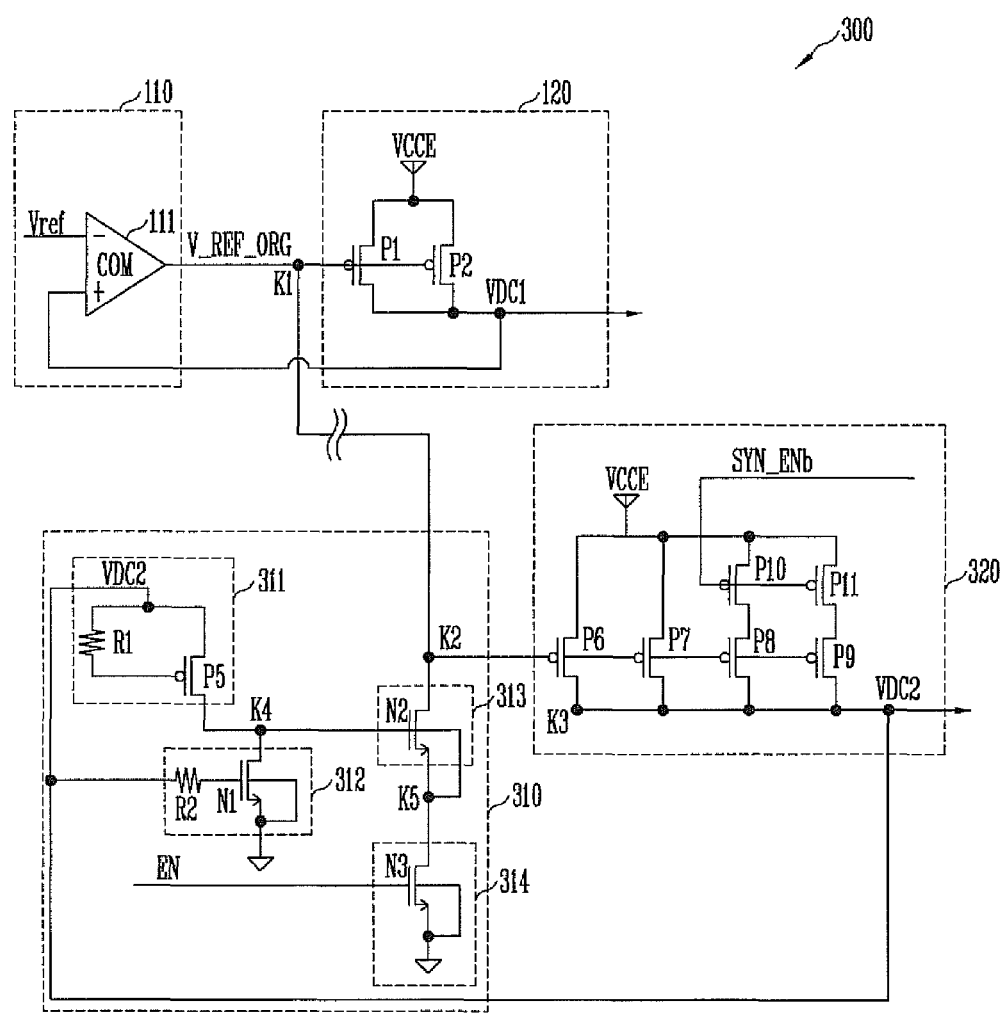
FIG. 3 is a circuit diagram of a voltage down converter according to an exemplary embodiment of this disclosure.

FIG. 3 is a circuit diagram of the voltage down converter according to the exemplary embodiment of this disclosure.

Referring to FIG. 3, the voltage down converter 300 according to the exemplary embodiment of this disclosure includes a control circuit 110, a first driver 120, a driving control circuit 310, and a second driver 320.

The control circuit 110 and the first driver 120 have the same construction as those of FIG. 2, and thus they are assigned the same reference numerals.

The driving control circuit 310 includes first to third driving controllers 311 to 313 and a driving circuit 314.

The second driver 320 outputs an input voltage VCCE as a second down voltage VDC2 in response to a driving voltage V_REF_ORG.

If a node K1 where the driving voltage V_REF_ORG is outputted from the control circuit 110 is far from a node K2 where the driving voltage V_REF_ORG is inputted to the second driver 320, the driving voltage V_REF_ORG may be distorted, so that the second down voltage VDC2 may not maintain a certain level.

In particular, when the driving voltage V_REF_ORG shifts from a low level to a high level and then shifts to a low level again, if the time that the driving voltage V_REF_ORG inputted to the second driver 320 shifts to a low level is delayed, the second down voltage VDC2 outputted from the second driver 320 continues to drop.

When the driving voltage V_REF_ORG shifts from a low level to a high level, the second down voltage VDC2 may continue to rise because of the delay in the driving voltage V_REF_ORG inputted to the second driver 320. However, as the second down voltage VDC2 rises, the PMOS transistors P6 to P9 of the second driver 320 may be turned off to control the rise of the second down voltage VDC2.

In order to control a drop in the second down voltage VDC2, the driving control circuit 310 may change the driving voltage V_REF_ORG to a low level.

The third driving controller 313 is coupled between a node K5 and the node K2 to which the driving voltage V_REF_ORG is inputted. The driving circuit 314 couples the node K5 to a ground node in response to an enable signal EN. The enable signal EN may be inputted so that a control circuit, such as an integrated circuit (not shown) to which the voltage down converter 300 is applied, can control the operation of the second driver 320.

The driving control circuit 310 for controlling the operation of the second driver 320 can be selectively operated using the enable signal EN.

The first driving controller 311 includes a first resistor R and a fifth PMOS transistor P5.

The fifth PMOS transistor P5 is coupled between a node K4 and a node K3 from which the second down voltage VDC2 of the second driver circuit 320 is outputted. Furthermore, the first resistor R1 is coupled between the node K3 and the gate of the fifth PMOS transistor P5.

The second driving controller 312 includes a first NMOS transistor N1 and a second resistor R2. The first NMOS transistor N1 is coupled between the node K4 and the ground node. The second resistor R2 is coupled between the node K3 and the gate of the first NMOS transistor N1.

The third driving controller 313 includes a second NMOS transistor N2. The second NMOS transistor N2 is coupled between the node K2 and the node K5. The node K4 is coupled to the gate of the second NMOS transistor N2.

The first driving controller 311 detects whether a second down voltage VDC2 drops to a first voltage or lower. The second driving controller 312 detects whether the second down voltage VDC2 rises to a second voltage or higher.

Furthermore, the third driving controller 313 forcedly discharges the driving voltage V_REF_ORG, inputted to the node K2, depending on the operations of the first and the second driving controllers 311 and 312. At this time, the driving circuit 314 is to couple the node K5 to the ground node.

The driving circuit 314 includes a third NMOS transistor N3. The third NMOS transistor N3 is coupled between the node K5 and the ground node. The enable signal EN is inputted to the gate of the third NMOS transistor N3.

The node K5 may be coupled to the ground node without including the driving circuit 314, in order to determine the operation of the driving control circuit 310 only based on the level of the second down voltage VDC2.

The second driver 320 includes the sixth to eleventh PMOS transistors P6 to P11. The sixth and the seventh PMOS transistors P6 and P7 are coupled between a terminal to which the input voltage VCCE is inputted and the node K3 from which the second down voltage VDC2 is outputted.

The gates of the sixth and the seventh PMOS transistors P6 and P7 are coupled to the node K2.

The eighth and tenth PMOS transistors P8 and P10 are coupled in series between the node K3 and the terminal to which the input voltage VCCE is inputted. A control signal SYN_ENb for raising the driving ability is inputted to the gate of the tenth PMOS transistor P10. The gate of the eighth PMOS transistor P8 is coupled to the node K2.

The ninth and eleventh PMOS transistors P9 and P11 are coupled in series between the node K3 and the terminal to which the input voltage VCCE is inputted. The control signal SYN_ENb is inputted to the gate of the eleventh PMOS transistor P11. The gate of the ninth PMOS transistor P9 is coupled to the node K2.

Like the enable signal EN, the control signal SYN_ENb may be received from the control circuit of an integrated circuit (not shown) to which the voltage down converter 300 is applied. The control signal SYN_ENb of a low level is received to increase the driving ability of the second driver 320.

The same circuit as the first driver 120 may be used as the second driver 320.

The third NMOS transistor N3 is turned on in response to the enable signal EN of a high level, thereby operating the driving control circuit 310. Accordingly, the node K5 is coupled to the ground node.

The second driver 320 outputs the second down voltage VDC2 in response to the driving voltage V_REF_ORG.

When the driving voltage V_REF_ORG is in a low level, the sixth to ninth PMOS transistors P6 to P9 are turned on. When the control signal SYN_ENb of a high level is received, the input voltage VCCE is supplied to the sixth and the seventh PMOS transistors P6 and P7, and the second down voltage VDC2 is outputted to the node K3 by the sixth and seventh PMOS transistors P6 and P7.

When the control signal SYN_ENb of a low level is received, the input voltage VCCE is also inputted to the eighth and the ninth PMOS transistors P8 and P9, so that the driving ability is further increased.

Meanwhile, when the first down voltage VDC2 of the first driver 120 is higher than the reference voltage Vref, the comparator COM of the control circuit 110 outputs the driving voltage V_REF_ORG of a high level which is transferred to the second driver 320. In response to the driving voltage V_REF_ORG of a high level, the sixth to the ninth PMOS transistors P6 and P9 are turned off, so that the input voltage VCCE is not transferred to the node K3. Consequently, the second down voltage VDC2 slowly drops.

The first NMOS transistor N1 of the second driving controller 312 remains turned on in response to the second down voltage VDC2, and thus the node K4 keeps coupled to the ground node. Since the node K4 is coupled to the ground node, the second NMOS transistor N2 remains turned off.

Furthermore, the first down voltage VDC1 outputted from the first driver 120 slowly drops. When the first down voltage VDC is lower than the reference voltage Vref, the comparator COM outputs the driving voltage V_REF_ORG of a low level. Accordingly, the first down voltage VDC1 outputted from the first driver 120 rises again.

At this time, if the driving voltage V_REF_ORG shifting to a low level is not directly transferred to the node K2, but delayed, the second down voltage VDC2 outputted from the second driver 320 continues to drop.

Meanwhile, the second down voltage VDC2 inputted to the driving control circuit 310 drops to some degree while passing through the first resistor R1.

If the second voltage VDC2 continues to drop and then becomes a level adequate to turn on the fifth PMOS transistor P5, the fifth PMOS transistor P5 is turned on, so that the second down voltage VDC2 is inputted to the node K4.

Furthermore the second down voltage VDC2 drops while passing through the second resistor R2, and the dropped voltage prevents the first NMOS transistor N1 from being turned on.

Accordingly, when the second NMOS transistor N2 is turned on by the second down voltage VDC2 inputted to the node K4, the ground node coupled to the node K5 is also coupled to the node K2. That is, the node K2 is coupled to the ground node through the node K5.

Accordingly, the driving voltage V_REF_ORG is rapidly discharged, thus shifting to a low level. That is, when the driving voltage V_REF_ORG of a low level outputted from the control circuit 110 is not transferred due to delay and the voltage of the node K2 still remains in a high level, it may be rapidly discharged to a low level by the driving control circuit 310.

When the driving voltage V_REF_ORG is discharged to turn on the sixth and the seventh PMOS transistors P6 and P7, the input voltage VCCE is transferred to the node K3. Accordingly, the second down voltage VDC2 no longer drops, but rises again.

When the second down voltage VDC2 rises, the fifth PMOS transistor P5 is turned off and the first NMOS transistor N1 is turned on. Accordingly, the node K4 is coupled to the ground node again, so that the second NMOS transistor N2 is turned off.

After the second NMOS transistor N2 is turned off, the second driver 320 controls the second down voltage VDC2 based on the driving voltage V_REF_ORG.

Accordingly, even although the driving voltage V_REF_ORG of the control circuit 110 is not transferred due to delay, the second down voltage VDC2 outputted from the second driver 320 can be prevented from excessively dropping.

According to the voltage down converter of this disclosure, the time for inputting a feedback voltage to the comparator for controlling an output voltage can be reduced. Accordingly, the feedback voltage can rapidly respond to a shift of the output voltage, and the output voltage may be properly supplied.

What is claimed is:

1. A voltage down converter, comprising:
a first driver having a first input terminal configured to generate a first voltage by using an external voltage in response to a first driving signal being inputted to the first input terminal;
a control circuit configured to output the first driving signal to the first input terminal in response to a level of the first voltage;
a second driver having a second input terminal configured to generate a second voltage by using the external voltage in response to the first driving signal or a second driving signal being inputted to the second input terminal, wherein the first driving signal is transferred from the first input terminal to the second input terminal through a conductive line; and
a driving control circuit configured to generate the second driving signal and transferred to the second input terminal in response to a level of the second voltage.

2. The voltage down converter of claim 1, wherein the first driver comprises a plurality of transistors turned on or off in response to the first driving signal being inputted to the first input terminal and coupled between a terminal to which the external voltage is inputted and a terminal from which the first voltage is outputted.

3. The voltage down converter of claim 1, wherein the second driver comprises a plurality of transistors turned on in response to the first or second driving signal being inputted to the second input terminal and coupled between a terminal to which the external voltage is inputted and a terminal from which the second voltage is outputted.

4. The voltage down converter of claim 1, wherein the driving control circuit comprises:

a first driving controller configured to supply the second voltage to a first node when the second voltage is a first set voltage or lower;

a second driving controller configured to couple the first node to a ground node when the second voltage is a second set voltage or higher; and a third driving controller configured to generate the second driving signal and transferred to the second input terminal in response to a level of voltage of the first node.

5. The voltage down converter of claim 4, wherein the third driving controller comprises:

a driving circuit configured to couple a third node to the ground node in response to an enable signal, and a first transistor coupled between the third node and the input terminal of the second driver and coupled to the first node through a gate, wherein the first transistor is turned on when the first driving controller is configured to supply the second voltage to the first node.

6. The voltage down converter of claim 5, wherein the first driving controller comprises:

a second transistor coupled between the first node and a terminal to which the second voltage is inputted, and a resistor coupled between a gate of the second transistor and the terminal to which the second voltage is inputted, wherein the second transistor is turned on when a voltage inputted to the gate of the second transistor is the first set voltage or lower.

7. The voltage down converter of claim 1, wherein the first driver is configured to output the first voltage by dropping a level of the external voltage in response to the first driving signal, and the second driver is configured to output the second voltage by dropping a level of the external voltage in response to the first or second driving signal.

8. A voltage down converter, comprising:

a first driver configured to output a first down voltage by dropping an external voltage in response to a driving signal inputted to a control node;

a second driver configured to output a second down voltage by dropping the external voltage in response to the driving signal inputted to the control node; and a control circuit configured to output the driving signal to the control node in response to a level of the first down voltage, a level of the second down voltage, and a reference voltage, wherein the control circuit is configured to control the second down voltage to be equal to or higher than a set voltage by discharging a voltage level of the driving signal.

9. The voltage down converter of claim 8, wherein the control circuit comprises:

a controller configured to output the driving signal to the control node in response to the level of the first down voltage, and a driving control circuit configured to control the second down voltage to be equal to or higher than the set voltage by discharging the voltage level of the driving signal when the second down voltage is lower than the set voltage.

\* \* \* \* \*